(12) United States Patent
Heinzelmann et al.

(10) Patent No.: US 11,482,829 B2
(45) Date of Patent: Oct. 25, 2022

(54) METHOD FOR CALIBRATING AT LEAST ONE LASER DIODE

(71) Applicant: Robert Bosch GmbH, Stuttgart (DE)

(72) Inventors: Julian Heinzelmann, Stuttgart (DE); Qipeng Hu, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 302 days.

(21) Appl. No.: 16/759,499

(22) PCT Filed: Sep. 27, 2018

(86) PCT No.: PCT/EP2018/076310
§ 371 (c)(1),
(2) Date: Apr. 27, 2020

(87) PCT Pub. No.: WO2019/101400
PCT Pub. Date: May 31, 2019

(65) Prior Publication Data
US 2020/0274316 A1  Aug. 27, 2020

(30) Foreign Application Priority Data

Nov. 22, 2017 (DE) .......................... 102017220807.4

(51) Int. Cl.
*H01S 5/00* (2006.01)
*H01S 5/06* (2006.01)

(52) U.S. Cl.
CPC .......... *H01S 5/0014* (2013.01); *H01S 5/0617* (2013.01)

(58) Field of Classification Search
CPC ... H01S 5/0014; H01S 5/0617; H04N 9/3155; H04N 9/3158; H04N 9/3161; H04N 9/3182
See application file for complete search history.

(56) References Cited

U.S. PATENT DOCUMENTS

| 5,019,769 | A | 5/1991 | Levinson |
| 6,661,820 | B1 * | 12/2003 | Camilleri ............ H01S 5/06835 372/38.07 |
| 7,515,128 | B2 * | 4/2009 | Dowling ............. H05B 47/165 345/82 |

(Continued)

FOREIGN PATENT DOCUMENTS

EP  2337170 A1  6/2011

OTHER PUBLICATIONS

Yu Zhao, "Junction temperature measurement of GaN-based light-emitting diodes using temperature-dependent resistance-Semiconductor Science and Technology," Jan. 30, 2014, Semiconductor Science and Technology-Semicond. Sci. Technol. 29 (2014), pp. 1-4.*

(Continued)

*Primary Examiner* — Omar S Ismail
(74) *Attorney, Agent, or Firm* — Norton Rose Fulbright US LLP; Gerard Messina

(57) ABSTRACT

A method for a calibration of at least one laser diode, in particular at least one laser diode of a laser projection device. The at least one laser diode is calibrated on the basis of a comparison of at least one currently acquired characteristic value of the at least one laser diode with at least one characteristic value, stored in at least one database, of a model laser diode that is at least substantially identical in construction to the at least one laser diode.

8 Claims, 2 Drawing Sheets

(56) References Cited

U.S. PATENT DOCUMENTS

| | | | | |
|---|---|---|---|---|
| 2004/0052299 | A1* | 3/2004 | Jay | G01M 11/335 374/1 |
| 2006/0221341 | A1* | 10/2006 | Paul | G01N 21/255 356/406 |
| 2006/0234386 | A1* | 10/2006 | Burns | A61B 5/14546 600/504 |
| 2008/0246419 | A1* | 10/2008 | Deurenberg | H05B 45/28 315/309 |
| 2009/0028199 | A1* | 1/2009 | Brown | H01S 5/06804 372/38.01 |
| 2009/0161707 | A1* | 6/2009 | Champion | H01S 5/0683 372/29.011 |
| 2010/0039908 | A1* | 2/2010 | Wu | G11B 7/0941 369/47.5 |
| 2013/0221857 | A1* | 8/2013 | Bowers | H05B 45/20 315/186 |
| 2014/0271328 | A1* | 9/2014 | Burris | B22F 12/43 419/53 |
| 2015/0333478 | A1 | 11/2015 | Abele et al. | |
| 2017/0180708 | A1* | 6/2017 | Hazeghi | H04N 13/254 |

OTHER PUBLICATIONS

International Search Report for PCT/EP2018/076310, dated Jan. 7, 2019.

* cited by examiner

METHOD FOR CALIBRATING AT LEAST ONE LASER DIODE

BACKGROUND INFORMATION

A method has been proposed for a calibration of at least one laser diode, in particular at least one laser diode of a laser projection device.

SUMMARY

The present invention is relates to a method for a calibration of at least one laser diode, in particular at least one laser diode of a laser projection device.

In accordance with an example embodiment of the present invention, in at least one method step, the at least one laser diode is calibrated on the basis of a comparison of at least one currently acquired characteristic value of the at least one laser diode with at least one characteristic value, stored in at least one database, of a model diode that is at least substantially identical in its construction to the at least one laser diode.

The laser diode is preferably configured to produce a laser beam. "Configured" is to be understood in particular as meaning specifically programmed, designed, and/or equipped. The statement that an object is configured to perform a particular function is to be understood in particular as meaning that the object performs and/or executes the particular function in at least one state of use and/or operating state. The laser beam preferably has a frequency from a spectral region, visible to the human eye, of an electromagnetic frequency spectrum. Preferably, the laser beam has a frequency from a red spectral region of the electromagnetic frequency spectrum, from a green spectral region of the electromagnetic frequency spectrum, or from a blue spectral region of the electromagnetic frequency spectrum. In particular, different laser diodes that produce laser beams having frequencies from different spectral regions of the electromagnetic spectrum can be calibrated using the method.

A "calibration of a laser diode" is to be understood in particular as an adaptation of an optical output power level of the laser diode, in particular as a function of an operating temperature of the laser diode. Preferably, the optical output power level of the laser diode corresponds to a power level of the laser beam produced by the laser diode. In particular, the laser diode can be situated in a laser projection device. Preferably, the calibration of the laser diode can take place during production of the laser projection device, upon a start of operation of the laser projection device, and/or during operation of the laser projection device. A "characteristic value of a laser diode" is to be understood in particular as a measurable physical variable of the laser diode. Preferably, the characteristic values of the laser diode can be a function of the operating temperature of the laser diode. The database can be realized in particular as a storage unit.

A "model laser diode that is at least substantially identical in its construction to the laser diode" is to be understood in particular as a laser diode that preferably has the same specifications as the laser diode to be calibrated, but that may nonetheless have differences from the laser diode to be calibrated, due to tolerances and/or resulting from production. The specifications of the laser diode and of the model laser diode can include in particular the frequency of the produced laser beam, a maximum and a minimum optical output power level of the laser diode and of the model laser diode, as well as additional specifications of the laser diode and of the model laser diode that appear appropriate to someone skilled in the art. The laser diode can have differences from the model laser diode in particular due to series production variation in a production of the laser diode and of the model laser diode, due to different manufacturers of the laser diode and of the model laser diode, due to various materials used in the production of the laser diode and the model laser diode, as well as due to additional reasons that appear appropriate to a person skilled in the art.

Preferably, an individual characteristic value of the laser diode, or a plurality of different characteristic values of the laser diode, can be acquired. In particular, the laser diode can be calibrated on the basis of a comparison of the individual currently acquired characteristic value of the laser diode with an individual characteristic value, stored in the database, of the model laser diode, or on the basis of a comparison of the plurality of different currently acquired characteristic values of the laser diode with a plurality of various characteristic values, stored in the database, of the model laser diode.

Using the example embodiment according to the present invention, a laser diode can advantageously be calibrated in particular more quickly than with the use of a method in which an access to characteristic values stored in a database is not carried out. Advantageously, the optical output power level of the laser diode can be adapted. Advantageously, the laser diode can be correctly operated. Advantageously, an image having correct brightness and/or color reproduction can be projected by the laser diode.

In addition, in accordance with an example embodiment of the present invention, it is provided that, in particular in at least one method step, in order to create the at least one database, characteristic values are acquired of a plurality of model laser diodes in all operating temperature ranges of the plurality of model laser diodes. Preferably, the plurality of model laser diodes includes the model laser diode that is at least substantially identical in construction to the laser diode to be calibrated. An operating temperature range of a model laser diode preferably includes all operating temperatures of the model laser diode at which the model laser diode can be operated without damage. In particular, different model laser diodes can have different operating temperature ranges. Preferably, from each model laser diode of the plurality of model laser diodes, a plurality of characteristic values at a plurality of operating temperatures within the operating temperature range of each model laser diode is acquired. In particular, the plurality of characteristic values of each of the model laser diodes is stored in the database. Advantageously, an extensive database can be created.

In addition, in accordance with an example embodiment of the present invention, it is provided that, in particular in at least one method step, for the creation of the at least one database at least temperature characteristic values and/or at least power characteristic values and/or at least threshold characteristic values and/or at least current characteristic values and/or at least wavelength characteristic values of the plurality of model laser diodes are acquired. A "temperature characteristic value of a model laser diode" is to be understood in particular as an operating temperature of the model laser diode at a particular electrical forward voltage of the model laser diode. On the basis of an acquisition of temperature characteristic values in the complete operating temperature range of the model laser diode, preferably a characteristic curve can be created that describes a functional dependence of the operating temperature of the model laser diode on the electrical forward voltage drop at the model laser diode. An electrical forward voltage is preferably an electrical voltage that drops at a laser diode in forward conduction.

A "power characteristic value of a model laser diode" is to be understood in particular as an optical output power level of the model laser diode at a particular operating temperature of the model laser diode. On the basis of the acquisition of power characteristic values in the complete operating temperature range of the model laser diode, preferably a characteristic curve can be created that describes the functional dependence of the optical output power of the model laser diode on the operating temperature of the model laser diode. A "threshold characteristic value of a model laser diode" is to be understood in particular as a threshold voltage and/or a threshold current of the model laser diode at a particular operating temperature of the model laser diode. On the basis of the acquisition of threshold characteristic values in the complete operating temperature range of the model laser diode, preferably a characteristic curve can be created that describes the functional dependence of the threshold voltage and/or of the threshold current of the model laser diode on the operating temperature of the model laser diode. The threshold voltage of the model laser diode is preferably the minimum electrical forward voltage that is applied at the model laser diode so that the model laser diode can produce a laser beam. The threshold current of the model laser diode is preferably a minimum electrical current that is sent through the model laser diode so that the model laser diode can produce a laser beam.

A "current characteristic value of a model laser diode" is to be understood in particular as the electrical current through the model laser diode at a particular operating temperature of the model laser diode. On the basis of the acquisition of current characteristic values in the complete operating temperature range of the model laser diode, preferably a characteristic curve can be created that describes the functional dependence of the electrical current through the model laser diode on the operating temperature of the model laser diode. A "wavelength characteristic value of a model laser diode" is to be understood in particular as a wavelength of the laser beam produced by the model laser diode at a particular operating temperature of the model laser diode. Instead of the acquisition of the wavelength of the laser beam produced by the model laser diode at a particular operating temperature of the model laser diode, an acquisition of the frequency of the laser beam produced by the model laser diode at a particular operating temperature of the model laser diode is also possible. On the basis of the acquisition of wavelength characteristic values in the complete operating temperature range of the model laser diode, preferably a characteristic curve can be created that describes the functional dependence of the wavelength of the laser beam produced by the model laser diode on the operating temperature of the model laser diode.

Preferably, the same characteristic values are acquired for each of the model laser diodes. For example, for each of the model laser diodes temperature characteristic values and power characteristic values are acquired, instead of acquiring only temperature characteristic values for some of the model laser diodes and only power characteristic values for some other of the model laser diodes. The more different characteristic values of the plurality of model laser diodes are acquired, the more extensive the database in particular can become, and the more precisely the laser diode can preferably be calibrated. Advantageously, a plurality of different characteristic values of the plurality of model laser diodes can be acquired. Advantageously, a versatile database can be created.

In addition, in accordance with an example embodiment of the present invention, it is provided that, in particular in a method step, a shift of an electrical forward voltage of the at least one laser diode is determined, and the shift of the electrical forward voltage of the at least one laser diode is taken into account in the calibration of the at least one laser diode. In particular, measurements of the electrical forward voltage of different laser diodes at the same ambient temperature may differ. In particular, a shift of the electrical forward voltage of the laser diode may occur. In particular, the shift of the electrical forward voltage may falsify the calibration of the laser diode. By determining and taking into account the shift of the electrical forward voltage of the laser diode in the calibration of the laser diode, in particular in the currently acquired characteristic value of the laser diode, a falsification of the calibration of the laser diode can advantageously be compensated. Advantageously, a correct calibration of the laser diode can be ensured.

In addition, in accordance with an example embodiment of the present invention, it is provided that, in particular in at least one method step, the at least one currently acquired characteristic value of the at least one laser diode is ascertained at a single operating temperature of the at least one laser diode. In particular, the currently acquired characteristic value of the laser diode is ascertained at a current operating temperature of the laser diode. Preferably, an ascertaining of the currently acquired characteristic value at a single operating temperature of the laser diode is sufficient for a calibration of the laser diode. In particular, a plurality of different currently acquired characteristic values of the laser diode at the same single operating temperature of the laser diode can be acquired. Advantageously, a variation of the operating temperature of the laser diode in order to ascertain the currently acquired characteristic value of the laser diode can be omitted. Advantageously, the ascertaining of the currently acquired characteristic value of the laser diode can be done in a time-efficient fashion.

In addition, in accordance with an example embodiment of the present invention, it is provided that, in particular in at least one method step, the at least one currently acquired characteristic value of the at least one laser diode at the single operating temperature of the at least one laser diode is compared with the characteristic values, stored in the at least one database, at the same operating temperature, and that, on the basis of the comparison of the characteristic values, the at least one model laser diode whose construction is at least substantially identical to that of the at least one laser diode is determined. In particular, it is checked which of the characteristic values stored in the database for a current operating temperature of the laser diode comes closest to the currently acquired characteristic value of the laser diode at the current operating temperature of the laser diode. The model laser diode to which the closest characteristic value stored in the database belongs is preferably the model laser diode that is at least substantially identical in construction to the laser diode. In particular, various characteristic values of the laser diode currently acquired at the single operating temperature of the laser diode can be compared with various characteristic values stored in the database for the same operating temperature. Preferably, a degree of accuracy of a determination of the model laser diode that is at least substantially identical in construction to the laser diode can be high. Advantageously, the laser diode that is at least substantially identical in construction to the laser diode can be ascertained.

In addition, in accordance with an example embodiment of the present invention, it is provided that in at least one method step the characteristic values of the at least one laser diode in the complete operating temperature range of the at least one laser diode are determined on the basis of the characteristic values of the at least one model laser diode that is at least substantially identical in construction to the at least one laser diode. In particular, when there is a change in the operating temperature of the laser diode, a characteristic value of the laser diode at a new operating temperature of the laser diode can be determined on the basis of a characteristic value of the model laser diode at the new operating temperature. Preferably, the characteristic value of the model laser diode at the new operating temperature can be adopted as the new characteristic value of the laser diode at the new operating temperature.

Advantageously, for the calibration of the laser diode, an acquisition of further characteristic values of the laser diode at further operating temperatures of the laser diode can be omitted. Advantageously, a calibration outlay can be kept low.

In addition, in accordance with an example embodiment of the present invention, it is provided that, in particular in at least one method step, the operating temperature of the at least one laser diode is ascertained on the basis of the electrical forward voltage of the at least one laser diode, and that the operating temperature of the at least one model laser diode is ascertained on the basis of the electrical forward voltage of the at least one model laser diode. In particular, there is a relationship between the electrical forward voltage of a laser diode and the operating temperature of the laser diode. Analogously, the same relationship exists between the electrical forward voltage of a model laser diode and the operating temperature of the model laser diode.

Preferably, the electrical forward voltage of the laser diode is a monotonically decreasing function of the operating temperature of the laser diode. The operating temperature of the laser diode can preferably be ascertained on the basis of the forward voltage of the laser diode. In particular, the operating temperature of the laser diode can be ascertained through a comparison of the electrical forward voltage dropped at the laser diode with a characteristic curve that describes the relationship between the electrical forward voltage of the laser diode and the operating temperature of the laser diode. Advantageously, an ascertaining of the operating temperature of the laser diode and of the model laser diode by a temperature sensor can be omitted. Advantageously, a measurement of the electrical forward voltage of the laser diode and of the model laser diode is faster and more accurate than the measurement of the operating temperature of the laser diode and of the model laser diode by a temperature sensor.

The method according to the present invention is not intended to be limited to the application and specific embodiment described above. In particular, the method according to the present invention for realizing a manner of functioning described herein can have a number of individual elements, components, and units, as well as method steps, differing from a number named herein.

In addition, when value ranges are indicated in the present disclosure, values lying within the named limits are also to be considered as disclosed, and as capable of being used as desired.

BRIEF DESCRIPTION OF THE DRAWINGS

Further advantages result from the description below of the figures. The figures show an exemplary embodiment of the present invention. The figures and the description contain numerous features in combination. The person skilled in the art will also consider the features individually and combine them to form appropriate further combinations, as needed.

DETAILED DESCRIPTION OF EXAMPLE EMBODIMENTS

Figure 1:
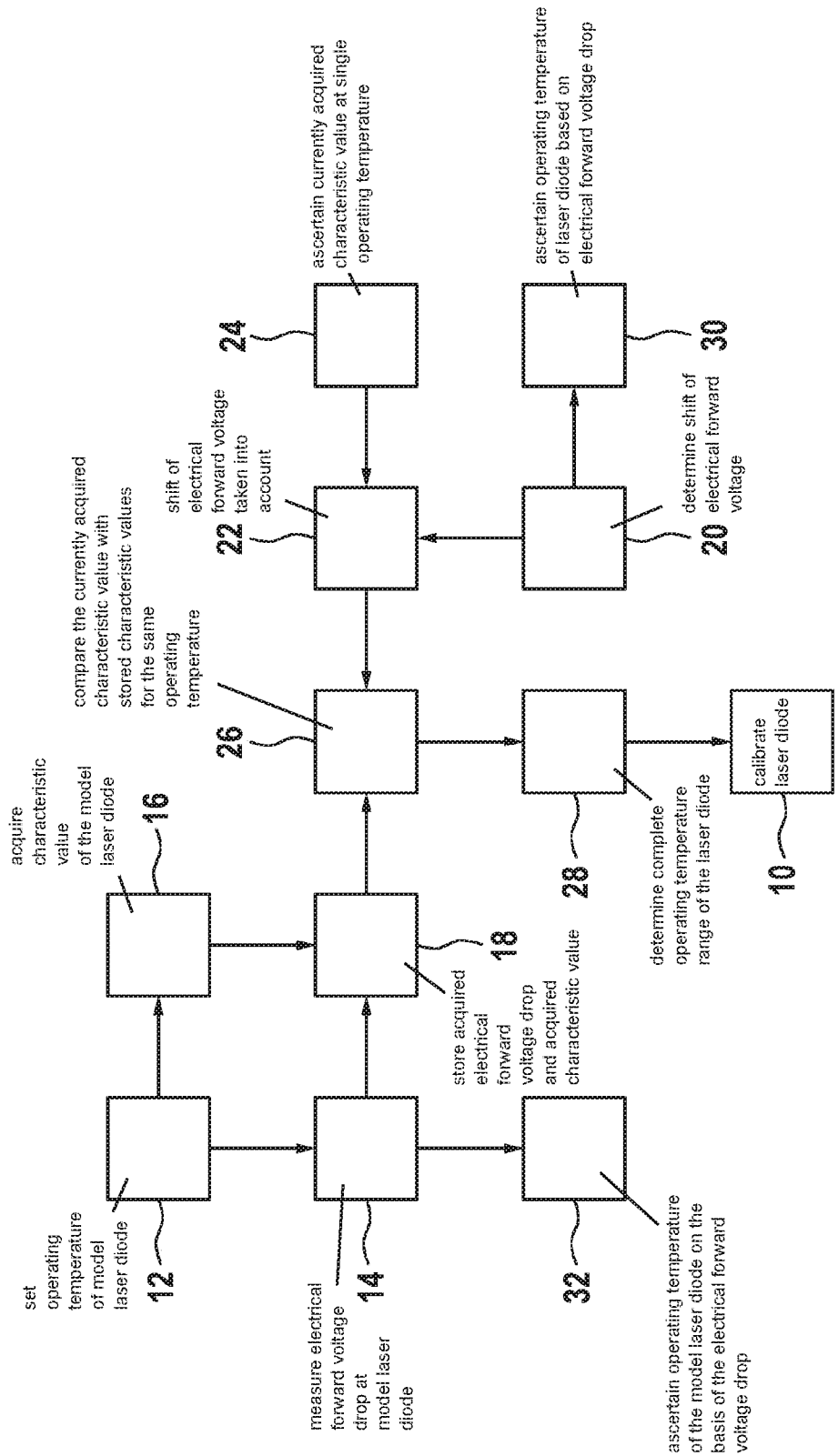
FIG. 1 shows an example method according to the present invention for a calibration of a laser diode, in a block diagram.

FIG. 1 shows an example method according to the present invention for a calibration of a laser diode, in a block diagram. In at least one method step 10, the laser diode is calibrated on the basis of a comparison of a currently acquired characteristic value of the laser diode with a characteristic value, stored in a database, of a model laser diode that is at least substantially identical in construction to the laser diode.

In at least one further method step, for the creation of the database characteristic values are acquired of a plurality of model laser diodes in all operating temperature ranges of the plurality of model laser diodes. In the following, the further method step is described on the basis of a single model laser diode. In at least one method substep 12, a particular operating temperature of the model laser diode is set. The particular operating temperature of the model laser diode is set for example using a Peltier element. A "Peltier element" is to be understood in particular as an electrothermal element that can produce a temperature difference based on a Peltier effect when there is a flow of an electrical current through the element. In at least one further method substep 14, at the set operating temperature of the model laser diode an electrical forward voltage dropped at the model laser diode is measured. The electrical forward voltage dropped at the model laser diode is measured for example using a voltage measuring device. In at least one further method substep 16, a characteristic value of the model laser diode is acquired. The characteristic value of the model laser diode is acquired for example using a characteristic value acquisition unit. The characteristic value acquisition unit can be designed depending on the type of acquired characteristic value of the model laser diode. For example, given acquisition of a power characteristic value, the characteristic value acquisition unit can be designed as a power measuring device. Different characteristic values of the model laser diode can be acquired using different characteristic value acquisition units. In at least one further method substep 18, the acquired electrical forward voltage and the acquired characteristic value of the model laser diode are stored in the database. A new operating temperature of the model laser diode is set, and the acquisition and storage of the electrical forward voltage and of the characteristic value of the model laser diode are repeated at the new operating temperature of the model laser diode. A process is repeated until characteristic values of the model laser diode have been acquired and stored in the database in the complete operating temperature range of the model laser diode.

For the creation of the database, temperature characteristic values, power characteristic values, threshold characteristic values, current characteristic values, and wavelength characteristic values of the plurality of model laser diodes are acquired. The various characteristic values are acquired for example using appropriate characteristic value acquisition units. Alternatively, it is possible for only a part of the various characteristic values to be acquired. The temperature characteristic values, power characteristic values, threshold characteristic values, current characteristic values, and wavelength characteristic values of the plurality of model laser diodes are stored in the database. The plurality of model laser diodes includes the model laser diode that is at least substantially identical in construction to the laser diode.

In at least one further method step 20, a shift of an electrical forward voltage of the laser diode is determined, and in at least one further method step 22 the shift of the electrical forward voltage of the laser diode is taken into account in the calibration of the laser diode. The electrical forward voltage of the laser diode is measured, for example using a further voltage measuring device. The shift of the electrical forward voltage of the laser diode is determined on the basis of the electrical forward voltage of the laser diode. The shift of the electrical forward voltage of the laser diode is determined for example using a computing unit. A "computing unit" is to be understood in particular as a controller having a processor, a storage unit, and/or an operating, control and/or calculating program stored in the storage unit. The shift of the electrical forward voltage of the laser diode is taken into account for example by the computing unit in the currently acquired characteristic value of the laser diode.

In at least one further method step 24, the currently acquired characteristic value of the laser diode is ascertained at a single operating temperature of the laser diode. The currently acquired characteristic value of the laser diode is ascertained for example using a further characteristic value acquisition unit.

In at least one further method step 26, the currently acquired characteristic value of the laser diode at the single operating temperature of the laser diode is compared with the characteristic values stored in the database for the same operating temperature, and the model laser diode that is at least substantially identical in construction to the laser diode is determined on the basis of the comparison of the characteristic values. The shift of the electrical forward voltage of the laser diode is taken into account in the currently acquired characteristic value of the laser diode. Of all the characteristic values stored in the database, the characteristic value stored in the database of the model laser diode that is at least substantially identical in construction to the laser diode comes closest to the currently acquired characteristic value of the laser diode.

In at least one further method step 28, the characteristic values of the laser diode in the complete operating temperature range of the laser diode are determined on the basis of the characteristic values of the model laser diode that is at least substantially identical in construction to the laser diode. When there is a change in the operating temperature of the laser diode, instead of an ascertaining of a new characteristic value of the laser diode at the new operating temperature, the corresponding characteristic value of the model laser diode that is at least substantially identical in construction to the laser diode is adopted for the laser diode.

In at least one further method step 30, the operating temperature of the laser diode is ascertained on the basis of the electrical forward voltage of the laser diode, and in at least one further method step 32 the operating temperature of the model laser diode is ascertained on the basis of the electrical forward voltage of the model laser diode. There is a relationship between the operating temperature of the laser diode, or of the model laser diode, and the electrical forward voltage of the laser diode, or of the model laser diode. The operating temperature of the laser diode is ascertained on the basis of a comparison of the electrical forward voltage of the laser diode with a characteristic curve that describes the relationship between the operating temperature of the laser diode and the electrical forward voltage of the laser diode. The operating temperature of the model laser diode is ascertained on the basis of a comparison of the electrical forward voltage of the model laser diode with a characteristic curve that describes the relationship between the operating temperature of the model laser diode and the electrical forward voltage of the model laser diode.

A sequence of the individual method steps of the method for a calibration of a laser diode is not intended to be limited to the sequence shown in FIG. 1. Preferably, other sequences of the individual method steps are possible, in particular a sequence of the individual method steps that appears appropriate to a person skilled in the art.

Figure 2:
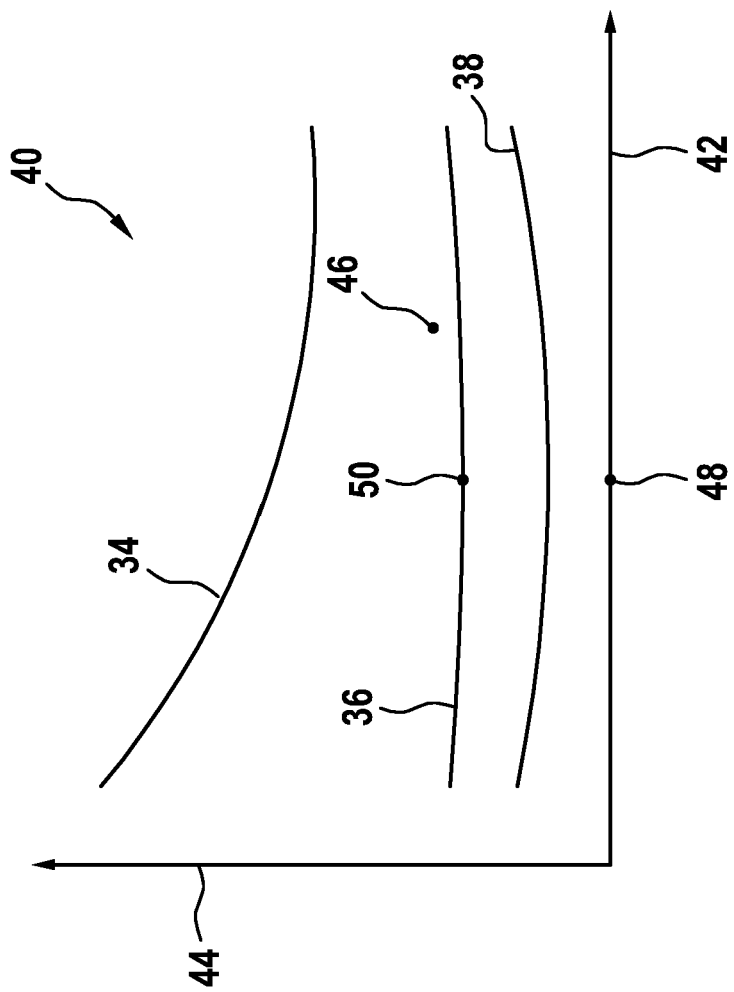
FIG. 2 shows example current characteristic curves of current characteristic values, stored in a database, of three model laser diodes.

FIG. 2 shows current characteristic curves 34, 36, 38 of current characteristic values, stored in the database, of three model laser diodes. The three model laser diodes have the same operating temperature ranges. There is a mathematically describable and deterministic relationship between the electrical current through the model laser diodes and the optical output power of the model laser diodes. Shown is a coordinate system 40 having an abscissa 42 and an ordinate 44. The electrical forward voltage is plotted on abscissa 42. There is a mathematically describable and deterministic relationship between the electrical forward voltage and the operating temperature. The electrical current through the model laser diodes, or the laser diode, is plotted on ordinate 44. When there is a connection of the electrical currents through the model laser diodes at various electrical forward voltages, there result the current characteristic curves 34, 36, 38 of current characteristic values, stored in the database, of the three model laser diodes.

Further shown is the currently acquired characteristic value of the laser diode as a point 46 in coordinate system 40. Point 46, which represents the currently acquired characteristic value of the laser diode, is closest to a second current characteristic curve 36. Second current characteristic curve 36 belongs to the model laser diode that is at least substantially identical in construction to the laser diode. The model laser diodes to which a first current characteristic curve 34 and a third current characteristic curve 38 belong are different in construction from the model laser diode that is at least substantially identical in construction to the laser diode. When there is a change in the operating temperature of the laser diode to a new operating temperature that corresponds to a value 48 of the electrical forward voltage of the laser diode, the current characteristic value of the model laser diode that is at least substantially identical in construction to the laser diode, identified by a further point 50 on second current characteristic curve 36, is adopted as the new characteristic value of the laser diode at the new operating temperature.

What is claimed is:

1. A method for a calibration of at least one laser diode, comprising the following steps:
acquiring at least one currently acquired characteristic value of the at least one laser diode;
comparing the at least one currently acquired characteristic value with at least one characteristic value, stored in a database, of a model laser diode that is at least substantially identical in construction to the least one laser diode; and calibrating the at least one laser diode based on the comparison, wherein the at least one database includes characteristic values of a plurality of model laser diodes acquired in all operating temperature ranges of the plurality of model laser diodes.

2. The method as recited in claim 1, wherein the at least one laser diode is of a laser projection device.

3. The method as recited in claim 1, wherein the at least one database includes at least temperature characteristic values and/or at least power characteristic values and/or at least threshold characteristic values and/or at least current characteristic values and/or at least wavelength characteristic values, of the plurality of model laser diodes.

4. The method as recited in claim 1, further comprising the following step:

determining a shift of an electrical forward voltage of the at least one laser diode, wherein the determined shift of the electrical forward voltage of the at least one laser diode is taken into account in the calibration of the at least one laser diode.

5. The method as recited in claim 1, wherein the at least one currently acquired characteristic value of the at least one laser diode is ascertained at a single operating temperature of the at least one laser diode.

6. A method for a calibration of at least one laser diode, comprising the following steps:

acquiring at least one currently acquired characteristic value of the at least one laser diode;

comparing the at least one currently acquired characteristic value with at least one characteristic value, stored in a database, of a model laser diode that is at least substantially identical in construction to the least one laser diode; and calibrating the at least one laser diode based on the comparison, wherein the at least one currently acquired characteristic value of the at least one laser diode is ascertained at a single operating temperature of the at least one laser diode wherein in the comparing step, the at least one currently acquired characteristic value of the at least one laser diode at the single operating temperature of the at least one laser diode is compared with characteristic values stored in the at least one database for the same operating temperature, and, based on the comparison of the characteristic values, the at least one model laser diode that is at least substantially identical in construction to the at least one laser diode is determined.

7. The method as recited in claim 1, wherein characteristic values of the at least one laser diode in a complete operating temperature range of the at least one laser diode are determined based on characteristic values, stored in the at least one database, of the at least one model laser diode that is at least substantially identical in construction to the at least one laser diode.

8. The method as recited in claim 6, further comprising the following step:

ascertaining an operating temperature of the at least one laser diode based on an electrical forward voltage of the at least one laser diode, and wherein an operating temperature of the at least one model laser diode is ascertained based on the electrical forward voltage of the at least one model laser diode.

* * * * *